United States Patent [19]

Shiloh et al.

[11] Patent Number: 4,633,919
[45] Date of Patent: Jan. 6, 1987

[54] MACHINE FOR CUTTING, BENDING AND FORMING AXIAL LEAD COMPONENTS

[76] Inventors: Adam Shiloh, 3517 Glen Way, Huntingdon Valley, Pa. 19006; Peretz J. Shiloh, 534 A Knights Bridge; Avraham Shiloh, 127 Thunder Cir., both of Bensalem, Pa. 19020

[21] Appl. No.: 661,699

[22] Filed: Oct. 16, 1984

[51] Int. Cl.4 .............................................. B21F 1/00
[52] U.S. Cl. ....................................... 140/105; 29/874
[58] Field of Search ............... 140/71 R, 105; 29/748, 29/874

[56] References Cited

U.S. PATENT DOCUMENTS

| 3,104,733 | 7/1964 | Ullman et al. | 140/71 R |
| 3,945,100 | 3/1976 | Whiting et al. | 29/748 X |
| 4,221,244 | 9/1980 | Weresch | 140/105 |
| 4,249,581 | 2/1981 | Weresch | 140/105 |

Primary Examiner—Howard N. Goldberg
Assistant Examiner—Carl J. Arbes
Attorney, Agent, or Firm—Steele, Gould & Fried

[57] ABSTRACT

A machine for cutting, bending and forming axial lead components is disclosed which includes a frame having sidewalls within which are journalled a drive shaft, a tooling shaft and a bender shaft. A plurality of toothed feed wheels and a first forming die are rotated by the drive shaft to carry the components through a rotary path. The tooling shaft is eccentrically adjustable and carries a prebend washer, a cutting wheel and a second forming die into the rotary path to prebend the axial leads, to trim the leads to size and to impress kinks or bows in the prebent and trimmed leads. The bender shaft is mounted in the sidewalls in eccentric bushings and supports a bend wheel in operative position in the rotary path to impose a final bend in the axial lead with the kink facing outwardly. Suitable component feed guides and stripping apparatus are employed to facilitate automatic operation of the machine.

17 Claims, 11 Drawing Figures

MACHINE FOR CUTTING, BENDING AND FORMING AXIAL LEAD COMPONENTS

BACKGROUND OF THE INVENTION

1. Field of the Invention

The present invention relates generally to the field of electronic component processing apparatus, and more particularly, is directed to a machine for cutting, bending and forming the leads of electrical circuit components such as resistors and capacitors.

2. Description of the Prior Art

In the design and production of various types of electrical and electronic equipment, numerous components having axial leads are utilized in the circuitry. Mass production techniques must be employed to minimize production costs, and these mass production procedures usually include the treatment of the components before delivery to the assembly line. Resistors, capacitors and other packaged electrical and electronic circuit components are usually provided in stock form with long leads for connection into the designed circuitry. Many prior art machines have been developed with the purpose of increasing the efficient treatment of these leads prior to actual use.

The long lead wires must be cut or trimmed to the required size and usually must also be bent or formed to a predetermined shape prior to soldering or otherwise being electrically connected into the circuitry. It is now standard practice for electronic equipment manufacturers to standardize designs and manufacturing techniques to enhance the production capability of a facility by increasing efficiency and consequently reducing production costs. One common practice that has been generally utilized to increase efficiency has been to uniformly trim, form and bend the component lead wires prior to delivery to the equipment production line.

In this manner, the time and energy of each production worker can be concentrated on the actual assembly of the equipment without requiring any slow down in production which would otherwise be required for individually cutting, forming and bending the leads of each of the components immediately prior to use. In the present state of the art, there are a large number of machines that have been designed to automatically cut and form the leads of such electrical components. These machines employ a large number of cooperating moving parts and many are capable of even inserting the formed components into a circuit board as part of the cyclical operation of the machine. However, all of these prior art machines suffer from the common disadvantages of being quite complicated in construction and therefore relatively expensive in manufacture due to their large number of cooperating moving parts. Additionally, due to the complexity of the prior art machines, these devices have been the subject of wear and frequent breakdowns, thereby seriously effecting the overall operating efficiency.

SUMMARY OF THE INVENTION

This invention relates to a machine especially designed for cutting, bending and forming the leads of electrical components wherein the machine is simple in structure, and economical in cost while requiring only a minimum of set-up time.

Briefly, the present invention includes a pair of feed guides suitable to feed electrical components serially into the peripheries of a plurality of rotatable, toothed feed wheels. The feed wheels receive individual components in axially aligned troughs between teeth and rotate in unison to rotatively advance the components through the apparatus wherein the leads are trimmed and bent, and wherein a small radius or kink is applied. The feed wheels carry the components toward a pair of spaced prebend tooling wherein initial bends of relatively small angularity are imposed upon the component leads. These initial bends or prebends serve to easily and efficiently orient the leads during the remaining treatment operations. It is of utmost importance during subsequent component treatment operations that the kinks in the leads be properly oriented and facing oppositely each other upon completion of the operations. The bow or prebend applied by the prebend tooling assures such proper orientation as the components are processed through the machine for subsequent, bending and forming operations.

Rotation therefore of the feed wheels carries the component leads into contact with rotary cutting wheels wherein the leads are cut to predetermined length. It is noteworthy that the cutting wheels and the prebend tooling are easily axially adjustable along their shaft whereby set-up time for differently sized electrical components can be minimized.

The prebent and cut leads are then rotatively carried by the feed wheels between a pair of rotatable male and female dies wherein a kink or small radius bend of predetermined configuration will be applied. The prebent or kinked component leads are then rotatively carried into engagement with shaft mounted bending wheels wherein the final bend configuration will be applied simultaneously to both component leads. Continued rotation of the toothed feed wheels carries the electronic component with the bent and kinked leads into a stationary ejector or ejectors wherein the components will be stripped from the feed wheels or bender wheels and dropped into a suitable detachable receptacle for delivery to the electrical assembly line.

The entire machine has been designed for quick set-up and adjustment and includes means to adjust the lateral and angular positions of the feed blocks or guides, means to axially adjust the location of the various rotatable feed wheels and means to axially adjust the position of the prebend tooling, the cutting wheels, the male and female forming dies and the final bend wheels. Additionally, the shaft upon which the cutting wheels and the male forming dies are mounted is equipped with eccentric fittings whereby the position of the cutting wheels and male forming dies relative to the drive shaft can be readily adjusted.

It is therefore an object of the present invention to provide an improved machine for cutting, bending and forming axial lead components of the type set forth.

It is another object of the present invention to provide a novel machine for cutting, bending and forming axial lead components that includes means to individually and serially feed electrical components having axial leads through the apparatus, means to prebend the component leads by applying a slight bow, means to trim the leads to predetermined size, means to form the previously cut leads and means to bend the cut and formed leads to the desired configuration.

It is another object of the present invention to provide a novel machine for cutting, bending and forming axial lead components which comprises a rotatable drive shaft carrying a plurality of toothed feed wheels, the drive shaft rotatively carrying a female bending die member therebetween, a tooling shaft rotatively mounted in spaced relationship from the drive shaft, the tooling shaft carrying prebend means, lead cutting means and cooperating male die forming means thereon, the toothed feed wheels carrying the components rotatively through the prebend means, the cutting means and male and female die forming means to large bending wheels wherein the previously cut, prebent and formed leads will be bent to the final configuration.

It is another object of the present invention to provide a novel machine for cutting, bending and forming axial lead components that is rugged in construction, easily adjustable to accommodate various sized components and trouble free when in use.

Other objects and a fuller understanding of the invention will be had by referring to the following description and claims of a preferred embodiment thereof, taken in conjunction with the accompanying drawings, wherein like reference characters refer to similar parts throughout the several views and in which:

DESCRIPTION OF THE PREFERRED EMBODIMENT OF THE INVENTION

Although specific terms are used in the following description for the sake of clarity, these terms are intended to refer only to the particular structure of the invention selected for illustration in the drawings, and are not intended to define or limit the scope of the invention.

Figure 1:
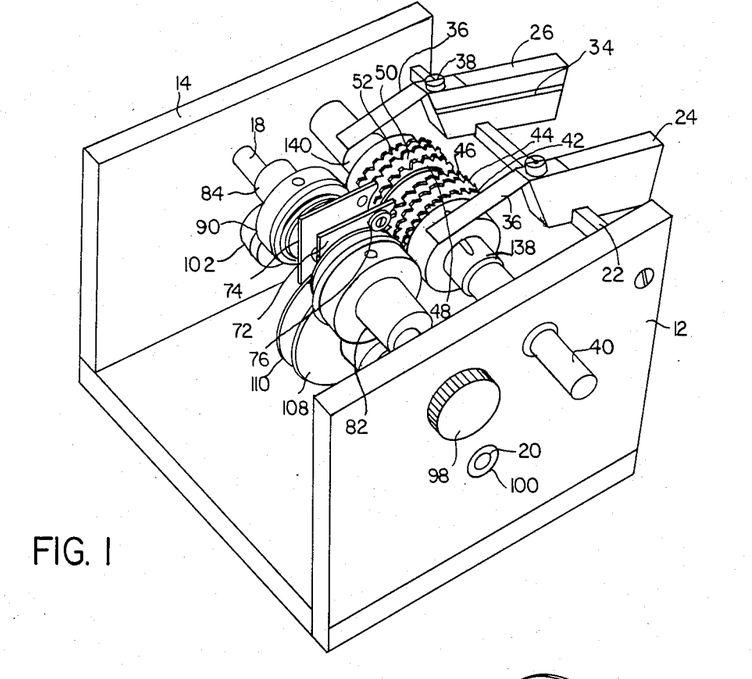
FIG. 1 is a perspective view of a machine for cutting, bending and forming axial lead components constructed in accordance with the teachings of the present invention.

Referring now to the drawings, there is illustrated in FIG. 1 a machine 10 comprising a frame including at least a pair of spaced sidewalls or supports 12, 14 of suitable spacing and strength to carry a plurality of transverse shafts 16, 18, 20, 22 therebetween. The feed guide shaft 22 is shown in square cross sectional configuration to securely support a pair of laterally adjustable, transversely spaced feed blocks or guides 24, 26. Each guide is provided with an interiorly facing slot 34 to receive and forwardly feed therethrough the respective lateral ends of left and right leads 30, 32 of a plurality of electrical components 28. Each feed block 24, 26 is laterally adjustable along the feed guide shaft 22 to readily vary the spacing between the feed guides to accommodate electrical components having leads of various lengths. Each feed block or guide 24, 26 rearwardly carries a leaf spring 36 connected by a fastener 38 to direct the components into engagement with the plurality of feed wheels 42–52. In the illustrated embodiment, the feed guides are utilized to feed carded components in an orderly manner. However, it will be appreciated that the machine 10 could also be employed to process loose, carded or taped components. In this latter regard, a loose or carded component feeder of the type manufactured and sold by Automated Production Systems, Inc., Bristol, Pa., the assignee of the present application, could be utilized in known manner.

Referring now to FIGS. 1, 2, 3 and 4, the drive shaft 16 includes a drive shaft extension 40 for rotatively functioning the shaft 16 either mechanically or manually (both not shown) in known manner. A plurality of left feed wheels 42, 44, 46 and right feed wheels 48, 50, 52 are secured on the drive shaft 16 in known, adjustable manner, for example by employing suitable collars 54, 56. The collars may be easily laterally adjusted along the drive shaft 16 by employing set screws 58 or other known devices in well known manner. It will be noted that the feed wheels 42–52 are similarly configured and comprise a plurality of teeth 122 and valleys 124 defined between the teeth. See FIG. 4. The axial leads 30, 32 of the components 28 are individually introduced into corresponding valleys 124 of the various feed wheels and are rotatively carried through the machine as the drive shaft 16 is rotated. See FIG. 3. Notched spacers 142 may be positioned intermediate adjacent feed wheels 42, 44 and 52, 50 to properly position the component leads as the components are rotatively carried.

Figure 2:
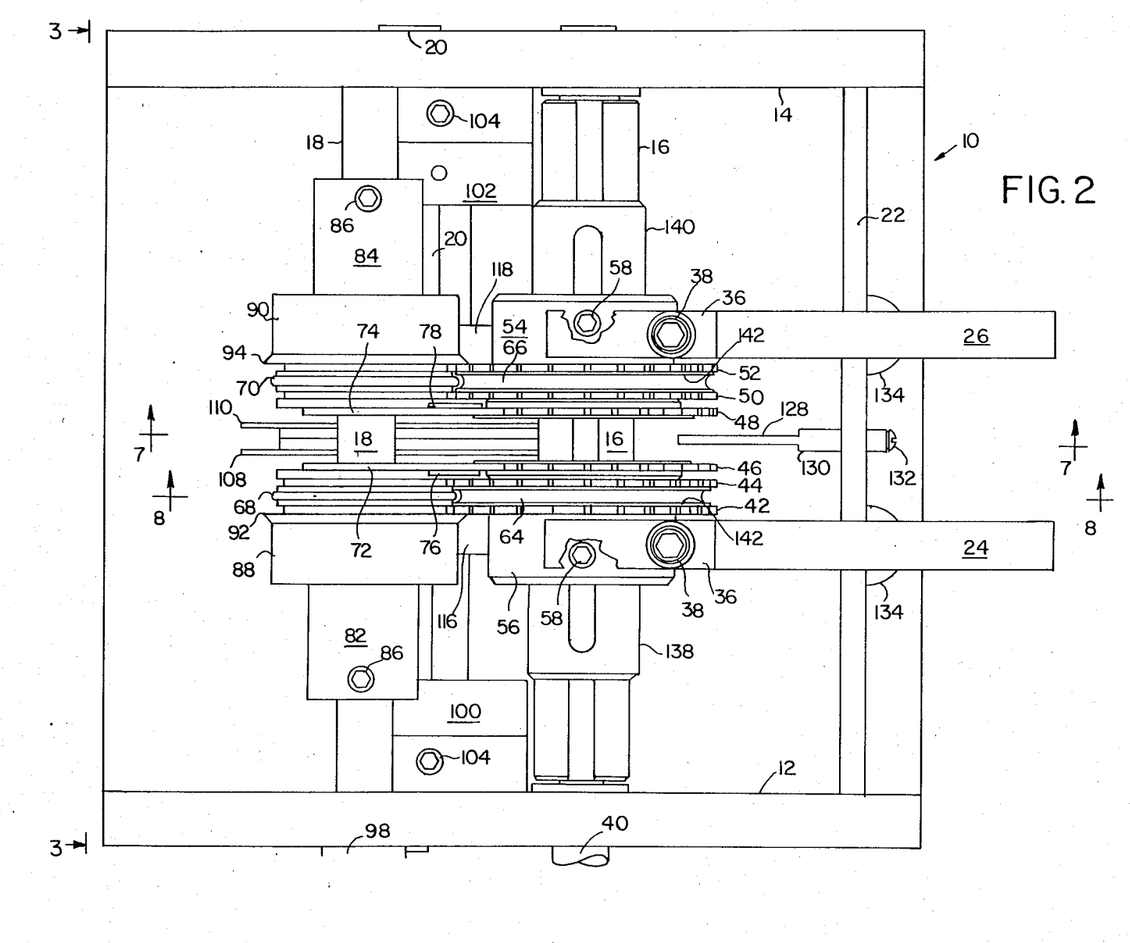
FIG. 2 is an enlarged, top plan view of the machine of FIG. 1.
Figure 4:
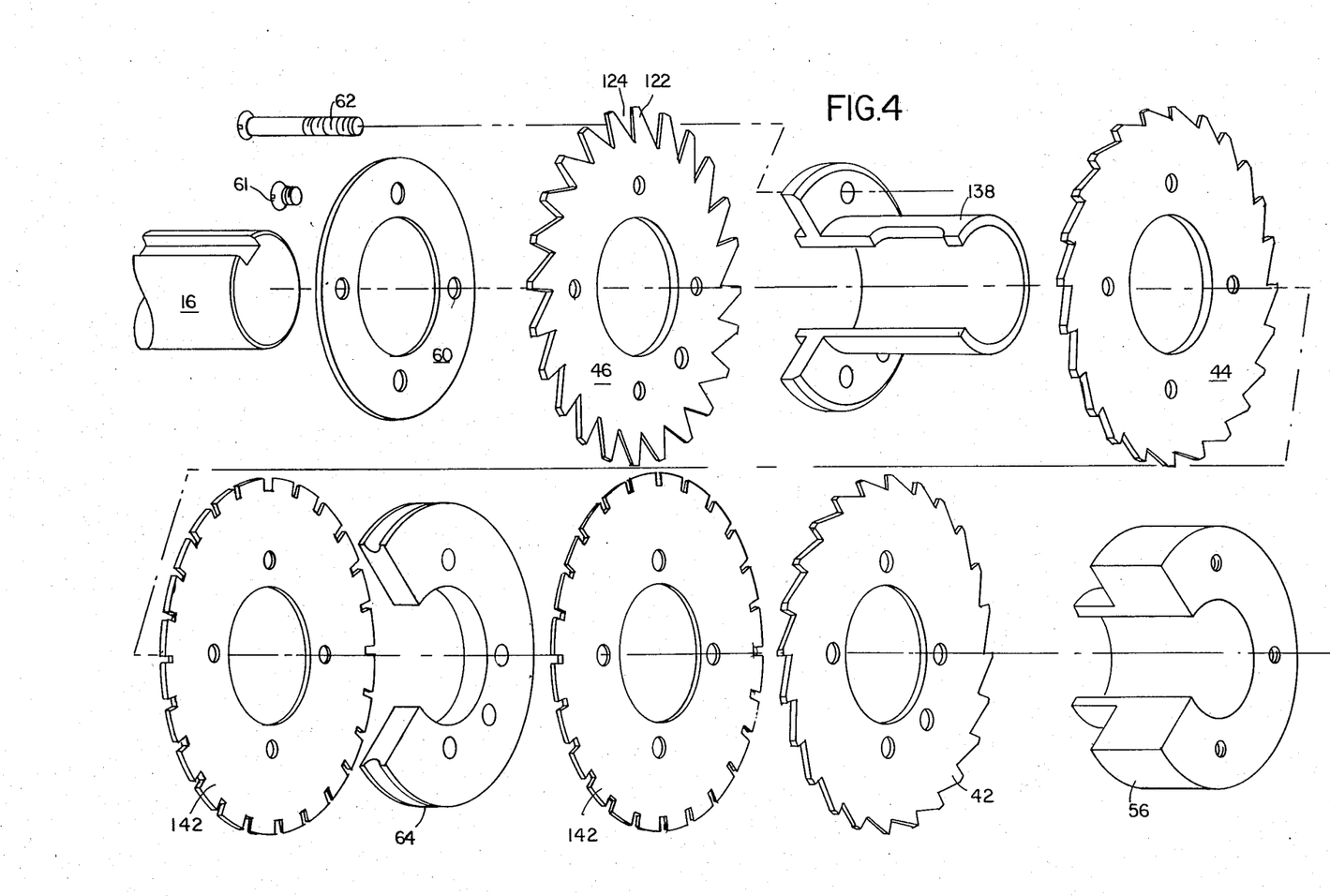
FIG. 4 is an enlarged, partial, exploded perspective view of the drive shaft and connected apparatus.
Figure 5:
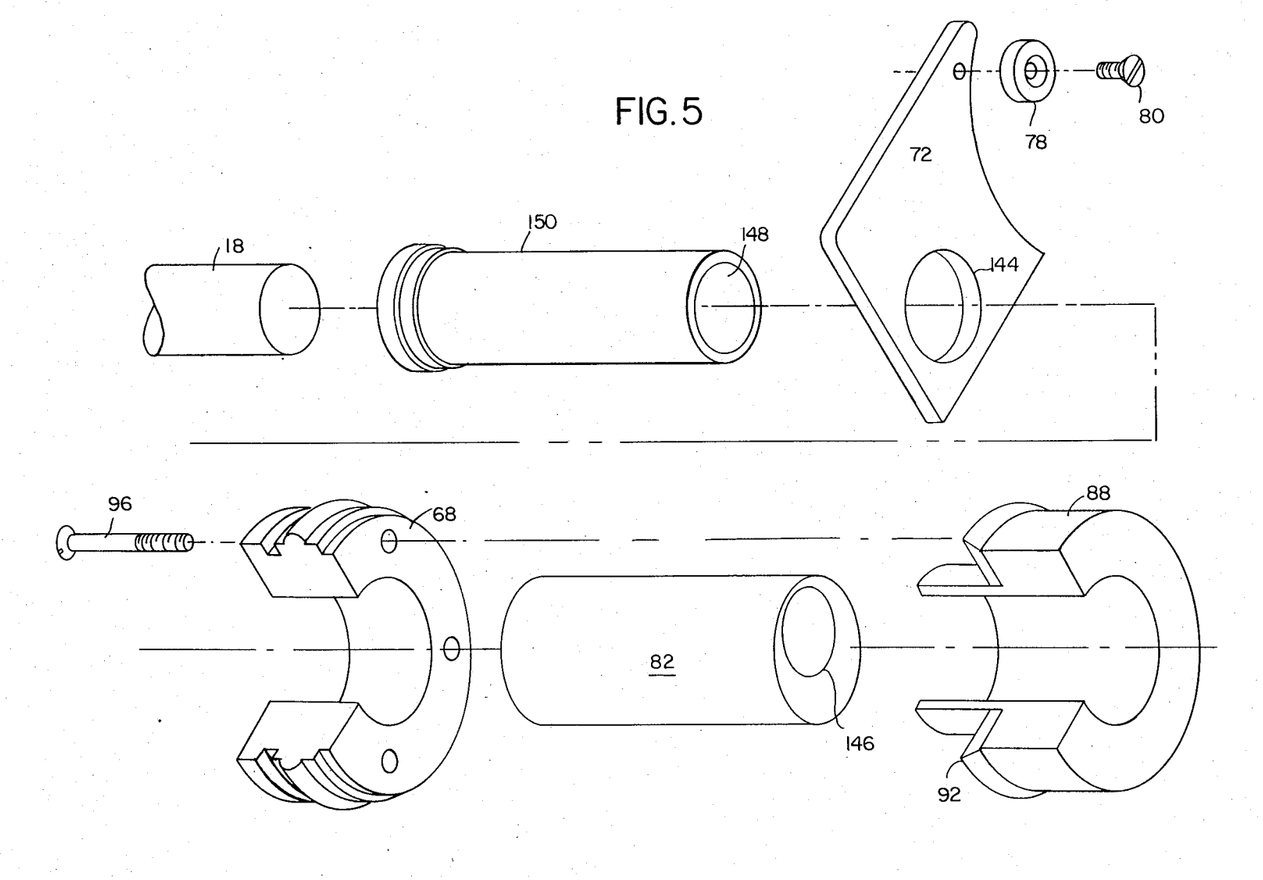
FIG. 5 is an enlarged, partial, exploded perspective view of the tooling shaft and connected apparatus.

As illustrated, left and right female forming dies 64, 66 are rotatively carried upon the drive shaft 16 for cooperative engagement with male forming dies 68, 70 in the manner hereinafter more fully set forth. See FIG. 2. As best seen in FIGS. 2 and 4, a mounting disc or plate 60 overfits the inner surface of the feed wheels 46, 48 provides a mounting surface for a plurality of threaded fasteners 61. The fasteners 62 laterally position through aligned holes in the feed wheels 42, 44, the female forming die 64 and the flange of the left adjusting bushing 138 and threadedly engage the tapped holes in the left collar 54 to thereby secure the parts together in an operating assembly. Similarly, on the right side of the shaft 16, fasteners 61 secure the right plate 60 to the inner face of the toothed feed wheel 48 and the fasteners 62 laterally position through aligned holes in the feed wheels 50, 52, the bushing 140 to thereby secure the parts together. Upon loosening a set screw 58, the collar 54 and thus the female forming die 64 can be easily laterally adjusted to any desired transverse position along the drive shaft 16. Similarly, the right feed wheels 48, 50, 52 and the right female forming die 66 are secured to the right collar 56 and can be laterally adjusted along the drive shaft 16 by moving the right collar 56.

Referring now to FIGS. 1, 2, 3 and 5, on the tooling shaft 18 are mounted left and right eccentric fittings 82, 84, which fittings can be laterally adjusted secured to the shaft 18 by employing set screws 86 in the usual manner. Left and right cutting wheels 88, 90 respectively secure to the eccentrics 82, 84 and can be laterally adjusted therealong. Interiorly of the left cutting wheel 88 is positioned the left male forming die 68 and the parts secured together by a plurality of threaded fasteners 96. Similarly, the right male forming die 70 is positioned upon the tooling shaft 18 interiorly of the right cutting wheel 90 and is secured thereto by fasteners. An adjustment knob 98 overfits the end of the tooling shaft 18 exteriorly of the left machine sidewall 12 to facilitate manual rotation of the shaft 18 to rotate the eccentrics 82, 84 in a manner to vary the center line distances between the respective pairs of male and female forming dies 68, 64 and 70, 66. The cutting edges 92, 94 of the free wheeling disc cutters 88, 90 shears the component leads 30, 32 simulantaneously to the desired lengths as each component is carried past by the rotation of the feed wheels 42, 44, 46, 48, 50, 52.

Figure 11:
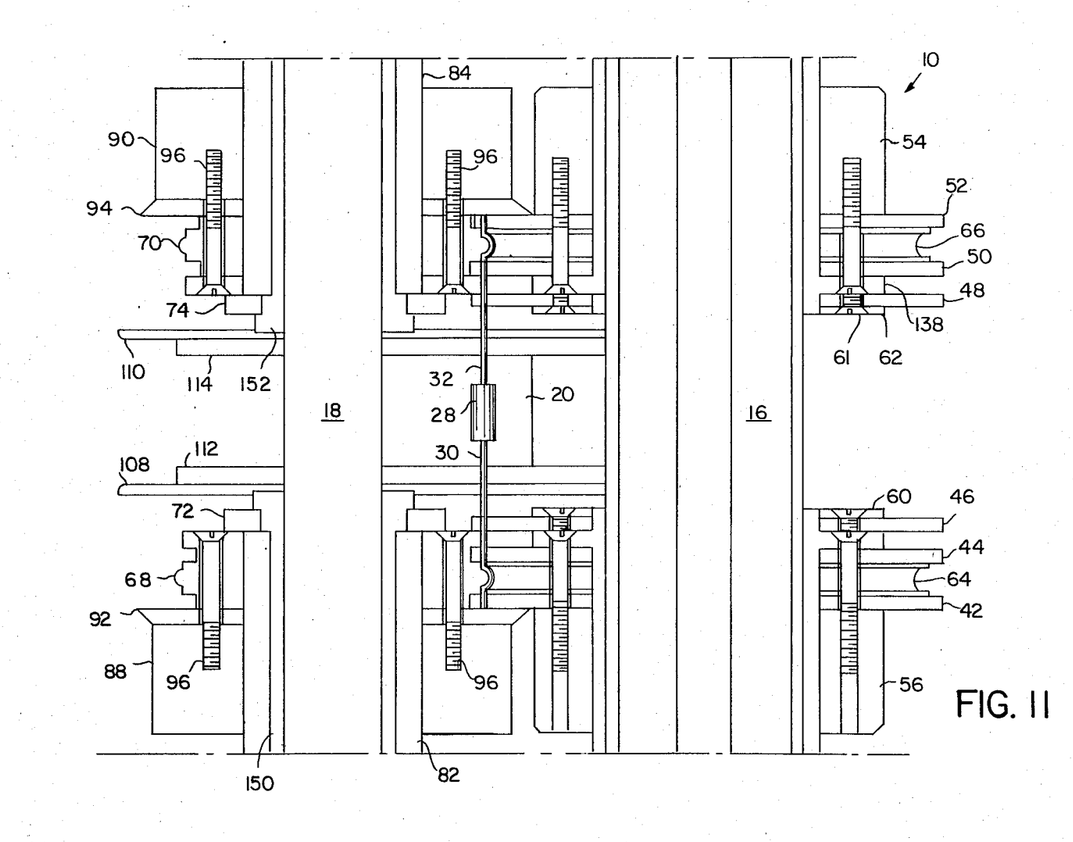
FIG. 11 is a partial, top plan view showing kinking of the component leads.

Left and right prebend plates 72, 74 include openings 144 which are pressed upon bushings 150, 152. FIG. 11. The bushings include openings 148 (FIG. 5) to receive the tooling shaft 18 and are movable on the tooling shaft 18. The eccentrics 82, 84 (FIG. 11) include longitudinal openings 146 for the tooling shaft 18. The prebend plates 72, 74 support respectively the left and right prebend washers 76, 78 and fasteners 80 secure the prebend washers 76, 78 to the plates 72, 74 in a position to be contacted by the leads 30, 32 of each electrical component 28 as the component is rotated by the plurality of the toothed feed wheels 42, 44, 46, 48, 50, 52. Continued rotation of each component rotatively past the prebend washers 76, 78 imposes an initial bend or bow in each component lead (See FIG. 9). These intial bends or prebends serve to properly orient the component leads during the subsequent cutting, kinking and bending operations to assure that the kinks imposed in each pair of component leads align and face oppositely in the final product as required during the electrical equipment assembly procedures (See FIG. 3).

Figure 3:
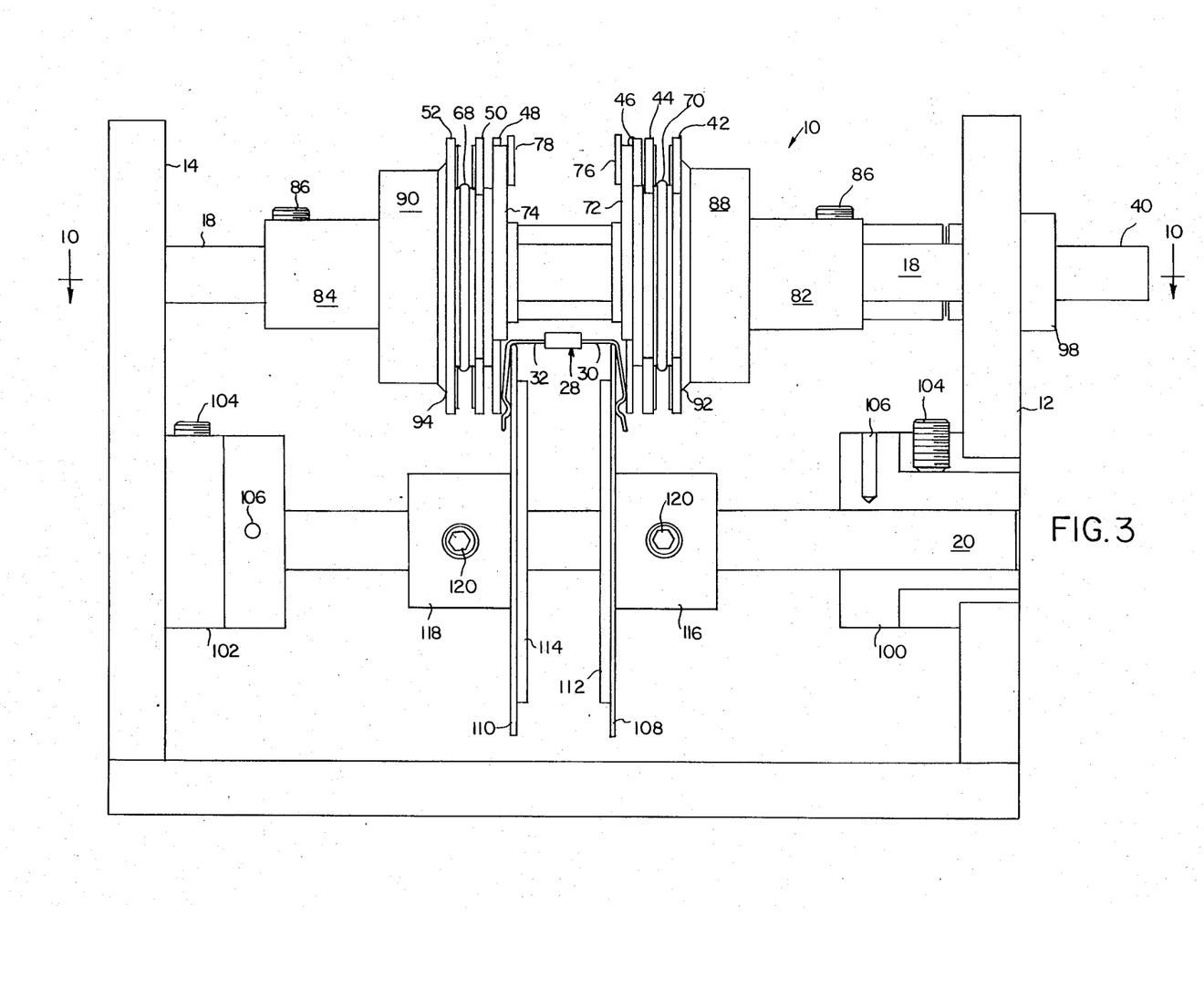
FIG. 3 is an enlarged, front elevational view of the machine of FIG. 1, looking from line 3—3 on FIG. 2 and showing the component leads being bent.
Figure 6:
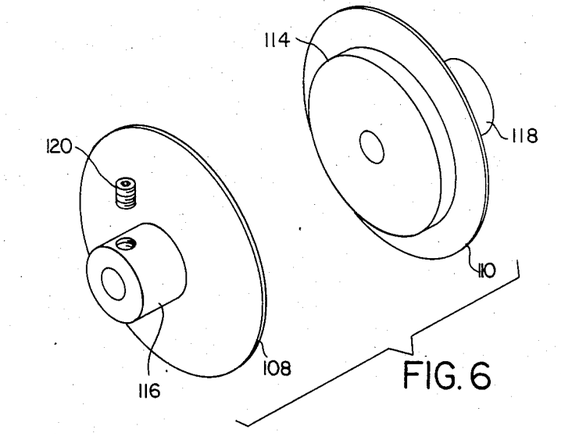
FIG. 6 is an enlarged, exploded perspective view of the bend wheels.
Figure 7:
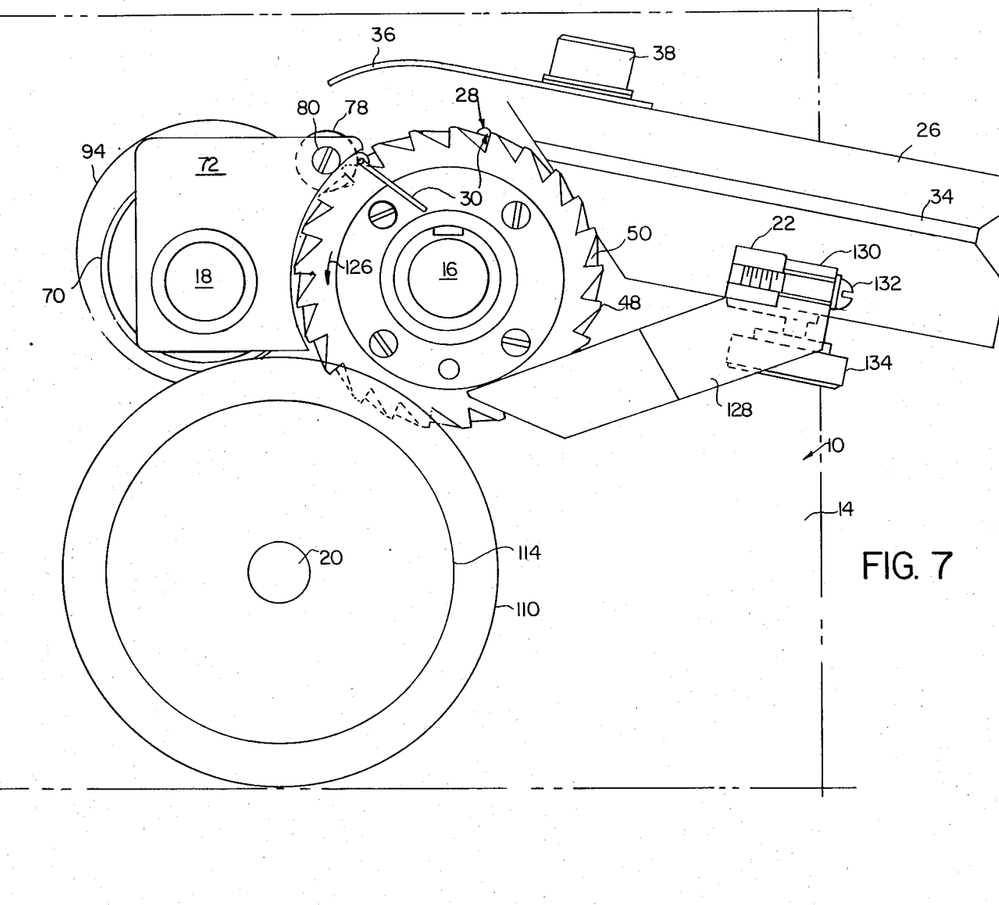
FIG. 7 is an enlarged, cross sectional view taken along line 7—7 on FIG. 2, looking in the direction of the arrows.
Figure 8:
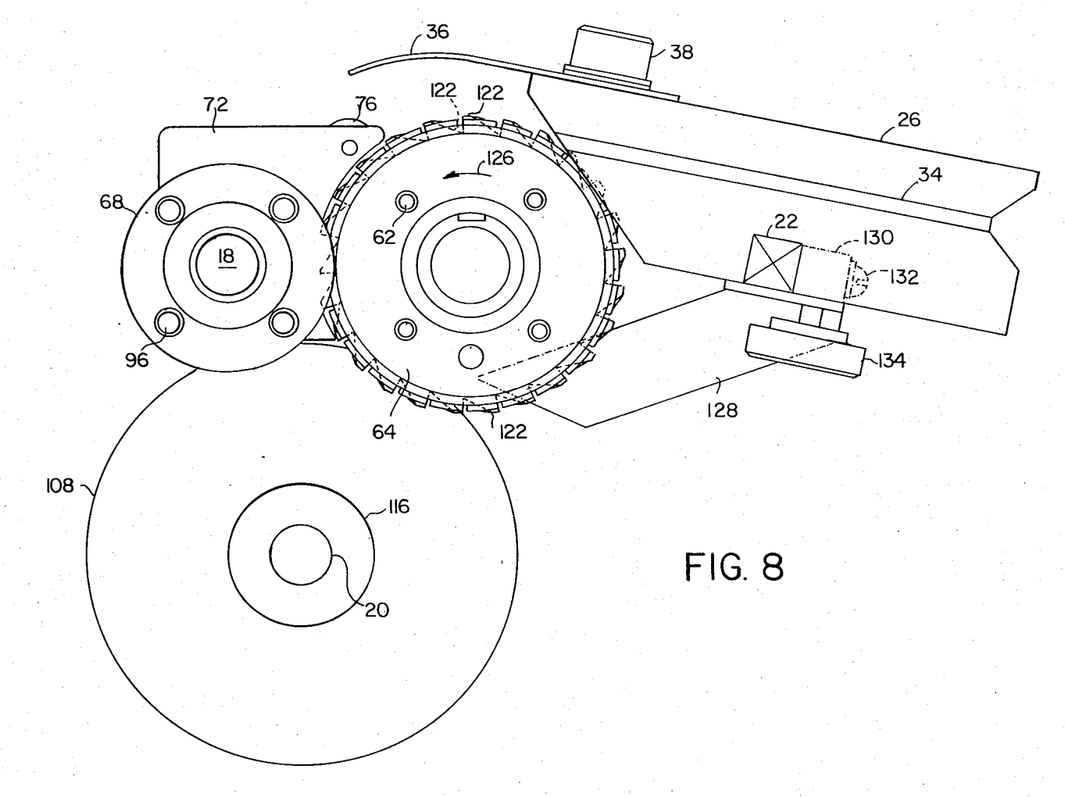
FIG. 8 is an enlarged, cross sectional view taken along line 8—8 on FIG. 2, looking in the direction of the arrows.

Referring now particularly to FIGS. 1, 3 and 6, the bender shaft 20 is illustrated below the tooling shaft 18 and extends transversely between the left and right machine supports 12, 14. Left and right eccentric bushings 100, 102 mount in openings in the left and right supports 12, 14 and may be eccentrically adjusted and set by employing conventional set screws 104. The left and right ends of the bender shaft 20 respectively position in the left and right eccentrics 100, 102 and are rotatable therewithin. An adjusting opening 106 can be provided in each of the eccentrics in known manner to facilitate positioning. Left and right hubs or collars 116, 118 can be secured upon the bender shaft 20 by conventional set screws 120 to secure the affixed bend wheels 108, 110 and bend wheel spacers 112, 114 in desired, transversely adjustable positions. As illustrated in FIGS. 3 and 7, the outer peripheries of the bend wheels 108, 110 intersect the outer peripheries of the feed wheels 42, 44, 46, 48, 50, 52 to impose substantially ninety degree or other angular bends upon the previously prebent, trimmed and kinked component leads 30, 32. Continued rotation of the feed wheels in the direction of the arrow 126 will carry the completed electrical components to the ejector 128 for stripping from the feed wheels and elimination from the machine. The ejector 128 can be conventionally secured to the square shaft 22 by employing a suitable bracket 130 and set screw 132.

Figure 9:
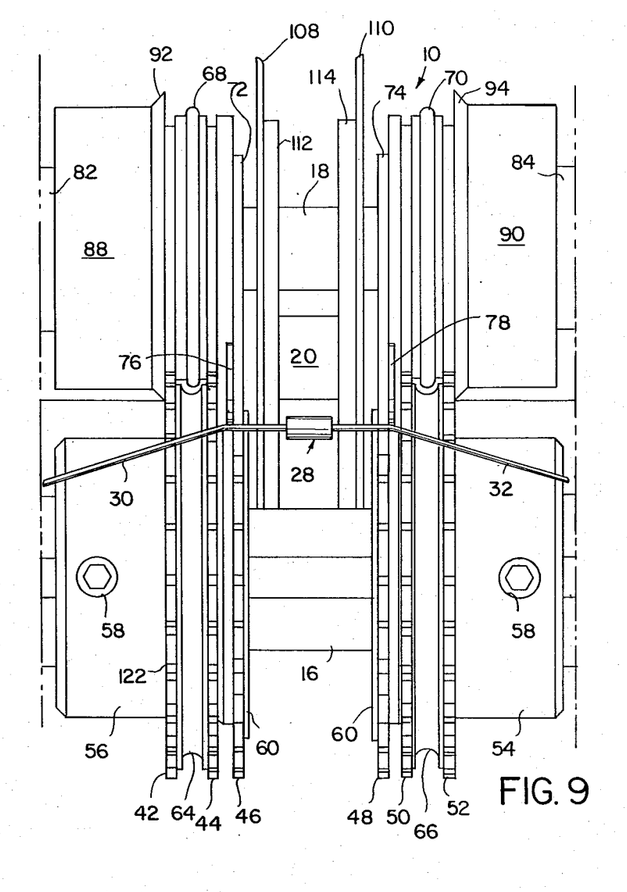
FIG. 9 is a partial, top plan view showing the prebend component lead treatment operation.

In operation, the feed guides 24, 26 direct a plurality of components 28 to the toothed feed wheels 42, 44, 46, 48, 50, 52 wherein the component leads 30, 32 will position in the valleys 124 and may rest in the notches provided in the intervening notched spacers. The feed wheels are rotated in unison by applying rotary forces upon the drive shaft extension 40 and rotatively carry the components to the pair of spaced, stationary prebend plates 72, 74. As best seen in FIG. 9, the action of the prebend plates 72, 74 against the component leads 30, 32 imposes slight bows or prebends to aid in orientation of the components during the subsequent forming and bending operations by preventing component axial rotation.

Figure 10:
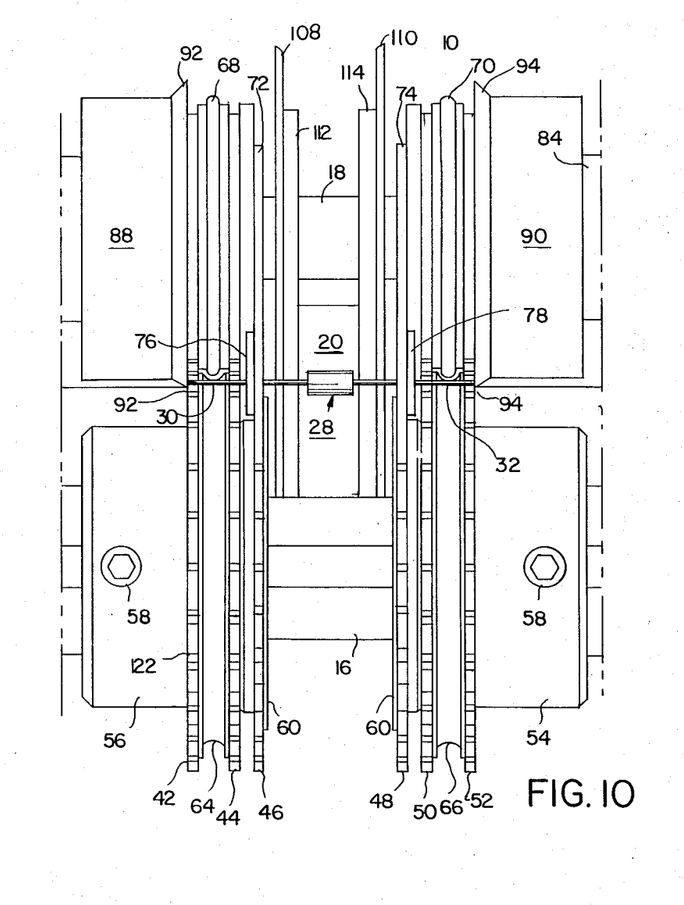
FIG. 10 is a partial, top plan view showing the component leads after trimming, looking from line 10—10 on FIG. 3.

Continued rotation of the drive shaft 16 rotatively carries each component in turn into contact with the cutting edges 92, 94 of the cutting wheels 88, 90. As illustrated in FIG. 10, the movement of the components rotatively past the cutting wheels 88, 90 trims or severs the component leads to the desired length. After trimming, as illustrated in FIG. 11, continued rotation of the drive shaft causes the lead wheels 42, 44, 46, 48, 50, 52 to rotatively carry the component leads 30, 32 between the male and female pairs of forming dies 68, 64 and 70, 66, wherein similar kinks are simultaneously formed.

The kinked and prebent leads are then rotated into contact with the spaced bend wheels 108, 110 wherein the final bend is made as best seen in FIG. 3. The final bend is formed directly over the prebend, whereby the prebend serves only an intermediate orienting function as the component leads are being treated in the machine 10. The trimmed, formed and bent components are stripped by the ejector 128 from the feed wheels whereupon the completed components can fall by gravity into a suitable bin (not shown) or other point of disposal.

It will be appreciated that the machine has been designed to incorporate ready lateral adjustment of all tooling and other apparatus along the transversely positioned shafts 16, 18, 20, 22. Also, the cutting and forming operations can be easily varied as to length or configuration by eccentrically adjusting the tooling shaft 18. The final bend can be modified by eccentrically adjusting the bender shaft 20 at the left and right bushings 100, 102.

Although the invention has been described with a certain degree of particularity, it is understood that the present disclosure has been made only by way of example and that numerous changes in the details of construction and the combination and arrangement of parts may be resorted to without departing from the spirit and scope of the invention. Thus, the scope of the invention should not be limited by the foregoing specification, but rather, only by the scope of the claims appended hereto.

What is claimed is:

1. A machine for processing the leads of electrical components comprising a frame comprising at least a support;

a drive shaft rotatably carried on the support, the drive shaft rotating a first rotary die member;

a plurality of electrical component advancing means secured to the drive shaft to rotatively move the electrical components within the machine, the component advancing means defining an outer periphery;

a tooling shaft carried on the support in spaced relation to the drive shaft, the tooling shaft carrying a second die member in tangential engagement with the first rotary die member to form a kink on the leads as the components are rotatively moved, cutter means defining an outer periphery and being affixed to the tooling shaft in spaced relation to the advancing means to trim the leads as they are rotatively moved by the component advancing means, the drive shaft and the tooling shaft being spaced apart by a distance suitable to permit the outer periphery defined by the component advancing means to intersect the outer periphery defined by the cutter means;

prebend means supported on the tooling shaft in spaced relation to the advancing means to slightly bend the leads as they are rotatively moved by the component advancing means, the prebend means being positioned to be contacted by the leads of the electrical components as the electrical components are rotatively moved by the advancing means;

a bender shaft carried upon the support in spaced relation to the tooling shaft, and a bender means having an outer periphery and being secured to the bender shaft in position whereby its said outer periphery peripherally intersects the outer periphery of the component advancing means to bend the component to an angle of approximately ninety degrees as the drive shaft is rotated;

whereby the component leads can be trimmed, prebent, kinked and/or bent as they are rotatively advanced through the machine.

2. The machine of claim 1 wherein the component advancing means comprises a plurality of toothed wheels wherein the wheel teeth define valleys therebetween and wherein the leads are positioned within the valleys as the components are advanced.

3. The machine of claim 2 and component feed guide means secured on the said support in angular relationship to the drive shaft to introduce the component leads into the valleys of the toothed wheels.

4. The machine of claim 1 wherein the prebend means comprises a prebend plate the prebend plate being positioned to be contacted by a component lead as the component is rotatively moved within the machine by the electrical component advancing means.

5. The machine of claim 4 wherein the prebend means further comprises a bushing on the tooling shaft, the prebend plate being secured to the bushing.

6. The machine of claim 1 wherein the cutter means comprises a rotary cutter having an outer periphery and an eccentric fitting interposed between the rotary cutter and the tooling shaft whereby the distance between the periphery of the rotary cutter and the periphery of the component advancing means can be varied by rotating the position of the eccentric fitting relative to the tooling shaft.

7. The machine of claim 6 wherein the second rotary die member is mounted upon the eccentric fitting whereby the distance between the first rotary die member and the second rotary die member can be varied.

8. The machine of claim 1 and means to vary the spacing between the bender shaft and the tooling shaft to vary the position of the intersection of the said respective outer peripheries of the electrical component advancing means and the bender means, the means to vary being secured to the said bender shaft.

9. The machine of claim 8 wherein the means to vary comprises an eccentric bushing interposed between the bender shaft and a support.

10. The machine of claim 1 and feed guides secured to a support forwardly of the component advancing means.

11. The machine of claim 10 wherein the feed guides comprise facing grooves, the ends of the component leads being respectively positioned within a groove as the components are advanced toward the drive shaft.

12. The machine of claim 11 wherein a feed guide further comprises a wide spring, a portion of the wide spring overlying a portion of the component advancing means.

13. The maching of claim 10 and an ejector secured to a bottom portion of the outer periphery of the component advancing means to strip the treated components from the component advancing means.

14. The machine of claim 13 and a feed guide shaft secured to a support, the feed guides and the ejector being secured upon the feed guide shaft.

15. The method of cutting, bending and forming the leads of electrical components of the type having a pair of spaced axial leads comprising loading the electrical components onto a rotary feed wheel and moving the components through a circular path;

bending the axial leads in a first downstream position in the circular path as the electrical components are moved in the circular path to form an initial bend of less than ninety degrees in the leads of each electrical component;

forming shaped kinks in the leads in a first downstream position in the circular path;

bending the axial leads in a second downstream position in the circular path and providing a final bend in the leads having an angle of substantially ninety degrees;

cutting the leads as the components move through the circular path, and the cutting comprising placing rotary cutters on a tooling shaft and the feed wheel on a drive shaft and eccentrically adjusting the spacing between tooling shaft and the drive shaft.

16. The method of claim 15 wherein the forming comprises placing a first rotary die member on the tooling shaft, placing a cooperating second rotary die member on the drive shaft and moving end portions of the leads between the first and second rotary die members.

17. The method of claim 16 wherein the bending comprises placing circular bend wheels upon a bender shaft and eccentrically moving the bender shaft relative to the drive shaft and to the tooling shaft.

* * * * *